United States Patent
Hill et al.

(10) Patent No.: US 8,837,151 B2
(45) Date of Patent: Sep. 16, 2014

(54) MEMORY MODULES INCLUDING COMPLIANT MULTILAYERED THERMALLY-CONDUCTIVE INTERFACE ASSEMBLIES

(75) Inventors: Richard F. Hill, Parkman, OH (US); Robert Michael Smythe, Ewing, NJ (US)

(73) Assignee: Laird Technologies, Inc., Earth City, MO (US)

( * ) Notice: Subject to any disclaimer, the term of this patent is extended or adjusted under 35 U.S.C. 154(b) by 332 days.

(21) Appl. No.: 13/329,825

(22) Filed: Dec. 19, 2011

(65) Prior Publication Data

US 2012/0087094 A1     Apr. 12, 2012

Related U.S. Application Data

(63) Continuation of application No. 12/486,472, filed on Jun. 17, 2009, now Pat. No. 8,081,468.

(51) Int. Cl.
   *H05K 7/20*     (2006.01)

(52) U.S. Cl.
   CPC .. *H05K 7/20472* (2013.01); *H05K 2201/10159* (2013.01)
   USPC ........ 361/709; 361/704; 361/710; 428/320.2; 428/408

(58) Field of Classification Search
   USPC ................ 361/704, 709–710, 715, 717, 719
   See application file for complete search history.

(56) References Cited

U.S. PATENT DOCUMENTS

| | | | |
|---|---|---|---|
| 3,404,061 A | 10/1968 | Shane et al. | |
| 4,234,638 A | * 11/1980 | Yamazoe et al. | ............ 428/133 |
| 4,256,792 A | 3/1981 | Koepke et al. | |
| 4,466,483 A | 8/1984 | Whitfield et al. | |

(Continued)

FOREIGN PATENT DOCUMENTS

| | | |
|---|---|---|
| CN | 1150643 | 5/1997 |
| CN | 1418384 | 5/2003 |

(Continued)

OTHER PUBLICATIONS

Office Action dated Nov. 2, 2010 issued by the United States Patent and Trademark Office for U.S. Appl. No. 12/486,456 which lists the same inventors as the instant application but is not related through a priority claim; 11 pages.

(Continued)

*Primary Examiner* — Courtney Smith

(74) *Attorney, Agent, or Firm* — Harness, Dickey & Pierce, P.L.C

(57) ABSTRACT

According to various aspects of the present disclosure, exemplary embodiments are disclosed of thermally-conductive interface assemblies suitable for use in dissipating heat from one or more components of a memory module. The thermally-conductive interface assembly may generally include a flexible heat-spreading material having first and second sides and one or more perforations extending through the flexible heat-spreading material from the first side to the second side. The flexible heat-spreading material may be sandwiched between first and second layers of soft thermal interface material. A portion of the soft thermal interface material may be disposed within the one or more perforations. The thermally-conductive interface assembly may be positioned relative to one or more components of a memory module to provide a thermally-conductive heat path from the one or more components to the first layer of soft thermal interface material.

21 Claims, 4 Drawing Sheets

(56) References Cited

U.S. PATENT DOCUMENTS

| | | | |
|---|---|---|---|
| 4,471,837 A | 9/1984 | Larson | |
| 4,574,879 A | 3/1986 | DeGree et al. | |
| 4,602,314 A | 7/1986 | Broadbent | |
| 4,752,518 A | 6/1988 | Lohrke et al. | |
| 4,776,602 A * | 10/1988 | Gallo | 277/592 |
| 4,812,792 A * | 3/1989 | Leibowitz | 333/238 |
| 4,878,152 A | 10/1989 | Sauzade et al. | |
| 4,996,115 A | 2/1991 | Eerkes et al. | |
| 5,100,737 A | 3/1992 | Colombier et al. | |
| 5,198,063 A | 3/1993 | Howard et al. | |
| 5,213,868 A | 5/1993 | Liberty et al. | |
| 5,221,575 A | 6/1993 | Nakano et al. | |
| 5,298,791 A | 3/1994 | Liberty et al. | |
| 5,660,917 A | 8/1997 | Fujimori et al. | |
| 5,741,579 A | 4/1998 | Nishizawa | |
| 5,830,809 A | 11/1998 | Howard et al. | |
| 5,902,762 A | 5/1999 | Mercuri et al. | |
| 5,904,796 A | 5/1999 | Freuler et al. | |
| 6,027,807 A * | 2/2000 | Inoue et al. | 428/408 |
| 6,129,993 A | 10/2000 | Kumamoto et al. | |
| 6,131,651 A | 10/2000 | Richey, III | |
| 6,245,400 B1 | 6/2001 | Tzeng et al. | |
| 6,270,872 B1 | 8/2001 | Cline et al. | |
| 6,372,997 B1 | 4/2002 | Hill et al. | |
| 6,432,497 B2 | 8/2002 | Bunyan | |
| 6,482,520 B1 | 11/2002 | Tzeng | |
| 6,483,707 B1 | 11/2002 | Freuler et al. | |
| 6,503,626 B1 | 1/2003 | Norley et al. | |
| 6,555,223 B2 * | 4/2003 | Kubo | 428/408 |
| 6,617,517 B2 | 9/2003 | Hill et al. | |
| 6,620,515 B2 | 9/2003 | Feng et al. | |
| 6,657,297 B1 * | 12/2003 | Jewram et al. | 257/720 |
| 6,663,964 B2 | 12/2003 | Mita et al. | |
| 6,761,928 B2 | 7/2004 | Hill et al. | |
| 6,777,086 B2 | 8/2004 | Norley et al. | |
| 6,783,692 B2 | 8/2004 | Bhagwagar | |
| 6,815,486 B2 | 11/2004 | Bhagwagar et al. | |
| 6,841,250 B2 | 1/2005 | Tzeng | |
| 6,886,249 B2 * | 5/2005 | Smalc | 29/890.03 |
| 6,898,084 B2 | 5/2005 | Misra | |
| 6,940,721 B2 | 9/2005 | Hill | |
| 6,982,874 B2 | 1/2006 | Smalc et al. | |
| 6,987,671 B2 | 1/2006 | Houle | |
| 7,078,109 B2 | 7/2006 | Hill et al. | |
| 7,119,432 B2 | 10/2006 | Desai et al. | |
| 7,138,029 B2 | 11/2006 | Norley et al. | |
| 7,150,914 B2 | 12/2006 | Clovesko et al. | |
| 7,160,619 B2 | 1/2007 | Clovesko et al. | |
| 7,176,502 B2 * | 2/2007 | Mazzochette et al. | 257/99 |
| 7,276,273 B2 | 10/2007 | Clovesko et al. | |
| 7,291,396 B2 | 11/2007 | Huang et al. | |
| 7,292,441 B2 | 11/2007 | Smalc et al. | |
| 7,303,005 B2 | 12/2007 | Reis et al. | |
| 7,303,820 B2 | 12/2007 | Capp et al. | |
| 7,306,847 B2 | 12/2007 | Capp et al. | |
| 7,393,428 B2 | 7/2008 | Huang et al. | |
| 7,393,587 B2 | 7/2008 | Krassowski et al. | |
| 7,419,722 B2 | 9/2008 | Ohta et al. | |
| 7,535,715 B2 | 5/2009 | Chung | |
| 7,799,428 B2 | 9/2010 | Fujiwara et al. | |
| 7,995,344 B2 | 8/2011 | Dando et al. | |
| 8,081,468 B2 | 12/2011 | Hill et al. | |
| 2002/0012762 A1 * | 1/2002 | Bunyan | 428/40.2 |
| 2002/0021997 A1 | 2/2002 | Taomoto et al. | |
| 2003/0017690 A1 | 1/2003 | Chason | |
| 2003/0019104 A1 | 1/2003 | Smalc | |
| 2004/0241397 A1 | 12/2004 | Klug et al. | |
| 2005/0039879 A1 | 2/2005 | Hanai | |
| 2005/0116387 A1 * | 6/2005 | Davison et al. | 264/293 |
| 2005/0175838 A1 | 8/2005 | Greinke et al. | |
| 2006/0099406 A1 | 5/2006 | Norley et al. | |
| 2006/0225874 A1 | 10/2006 | Shives et al. | |
| 2007/0042188 A1 | 2/2007 | Clovesko et al. | |
| 2007/0053168 A1 | 3/2007 | Sayir et al. | |
| 2007/0077434 A1 | 4/2007 | Clovesko et al. | |
| 2007/0102142 A1 | 5/2007 | Reis et al. | |
| 2007/0139895 A1 | 6/2007 | Reis et al. | |
| 2007/0187907 A1 | 8/2007 | Potier | |
| 2007/0257359 A1 * | 11/2007 | Reis et al. | 257/723 |
| 2008/0099515 A1 | 5/2008 | Szuch | |
| 2008/0099909 A1 * | 5/2008 | Baek et al. | 257/715 |
| 2008/0292840 A1 | 11/2008 | Majumdar et al. | |
| 2009/0000309 A1 | 1/2009 | Hershberger et al. | |
| 2009/0215209 A1 | 8/2009 | Anc et al. | |
| 2010/0321895 A1 | 12/2010 | Hill et al. | |
| 2010/0321897 A1 * | 12/2010 | Hill et al. | 361/720 |

FOREIGN PATENT DOCUMENTS

| | | |
|---|---|---|
| CN | 101930952 | 12/2010 |
| EP | 1742524 | 10/2007 |
| JP | 362025440 | 2/1987 |
| JP | 04-40589 | 4/1992 |
| JP | 11340673 | 12/1999 |
| JP | 2003-008263 | 1/2003 |
| JP | 2003-181971 | 3/2003 |
| JP | 2001358264 | 6/2007 |
| JP | 2002038033 | 7/2008 |
| JP | 3145429 | 9/2008 |
| JP | 2011000884 | 11/2011 |
| TW | 201110282 | 3/2011 |
| WO | 2006/132695 | 12/2006 |
| WO | WO 2009/005899 | 1/2009 |

OTHER PUBLICATIONS

Office Action dated Feb. 23, 2011 issued by the United States Patent and Trademark Office for U.S. Appl. No. 12/486,456 which lists the same inventors as the instant application but is not related through a priority claim; 15 pages.

Office Action dated Jun. 3, 2011 issued by the United States Patent and Trademark Office for U.S. Appl. No. 12/486,456 which lists the same inventors as the instant application but is not related through a priority claim; 15 pages.

Chinese office action (and English summary) dated Jul. 29, 2011 from Chinese application No. 20100206279.0 which lists the same inventors as the instant application but is not related through a priority claim.

Japanese office action dated Apr. 3, 2012 from Japanese application No. 2010-123934; 4 pages. The instant application is a continuation of U.S. Appl. No. 12/486,472 (now U.S. Patent No. 8081468) which is the parent application to Japanese patent application No. 2010-123934.

* cited by examiner

MEMORY MODULES INCLUDING COMPLIANT MULTILAYERED THERMALLY-CONDUCTIVE INTERFACE ASSEMBLIES

CROSS-REFERENCE TO RELATED APPLICATION

This application is a continuation of U.S. patent application Ser. No. 12/486,472 filed Jun. 17, 2009 (which issues Dec. 20, 2011 as U.S. Pat. No. 8,081,468). The entire disclosure of the above application is incorporated herein by reference in its entirety.

FIELD

The present disclosure generally relates to memory modules including compliant multilayered thermal interface materials and assemblies for establishing thermal-conducting heat paths from heat-generating components to a heat dissipating member or heat sink.

BACKGROUND

This section provides background information related to the present disclosure which is not necessarily prior art.

Electronic components, such as semiconductors, transistors, etc., typically have pre-designed temperatures at which the electronic components optimally operate. Ideally, the pre-designed temperatures approximate the temperature of the surrounding air. But the operation of electronic components generates heat which, if not removed, will cause the electronic component to operate at temperatures significantly higher than its normal or desirable operating temperature. Such excessive temperatures may adversely affect the operating characteristics, lifetime, and/or reliability of the electronic component and the operation of the associated device.

To avoid or at least reduce the adverse operating characteristics from the heat generation, the heat should be removed, for example, by conducting the heat from the operating electronic component to a heat sink. The heat sink may then be cooled by conventional convection and/or radiation techniques. During conduction, the heat may pass from the operating electronic component to the heat sink either by direct surface contact between the electronic component and heat sink and/or by contact of the electronic component and heat sink surfaces through an intermediate medium or thermal interface material. The thermal interface material may be used to fill the gap between thermal transfer surfaces, in order to increase thermal transfer efficiency as compared to having the gap filled with air, which is a relatively poor thermal conductor. In some devices, an electrical insulator may also be placed between the electronic component and the heat sink, in many cases this is the thermal interface material itself.

SUMMARY

This section provides a general summary of the disclosure, and is not a comprehensive disclosure of its full scope or all of its features.

According to various aspects of the present disclosure, exemplary embodiments are disclosed of thermally-conductive interface assemblies suitable for use in dissipating heat from one or more components of a memory module. The thermally-conductive interface assembly may generally include a flexible heat-spreading material having first and second sides and one or more perforations extending through the heat-spreading material from the first side to the second side. The flexible heat-spreading material may be sandwiched between first and second layers of soft thermal interface material. A portion of the soft thermal interface material may be disposed within the one or more perforations. The thermally-conductive interface assembly may be positionable relative to one or more components of a memory module to provide a thermally-conductive heat path from the one or more components to the first layer of soft thermal interface material.

Other aspects relate to memory modules and other electronic devices that may include a thermally-conductive interface assembly. In an exemplary embodiment, a memory module generally includes a printed circuit board substrate having first and second sides and one or more electronic components on at least one of the first and second sides. At least one thermally-conductive interface assembly includes a flexible heat-spreading material between first and second layers of soft thermal interface material. The at least one thermally-conductive interface assembly is disposed relative to at least one of the first and second sides of the printed circuit board substrate such that there is a thermally-conductive heat path from one or more electronic components on the at least one of the first and second sides to the first layer of soft thermal interface material.

In another exemplary embodiment, a memory module includes a printed circuit board substrate having first and second sides and one or more electronic components on at least one of the first and second sides. At least one thermally-conductive interface assembly includes flexible heat-spreading material having first and second sides and at least one layer of soft, compliant thermal interface material along at least the first side of the flexible heat-spreading material. The at least one thermally-conductive interface assembly may be disposed relative to at least one of the first and second sides of the printed circuit board substrate such that there is a thermally-conductive heat path from one or more electronic components on the at least one of the first and second sides to the at least one layer of soft, compliant thermal interface material.

Additional aspects provide methods relating to thermally-conductive interface assemblies, such as methods of using and/or making thermally-conductive interface assemblies and methods of heat dissipation from a memory module. In an exemplary embodiment, a method generally includes positioning a thermally-conductive interface assembly, which comprises a flexible heat-spreading material encapsulated within and sandwiched between first and second layers of soft thermal interface material, such that a thermally-conductive heat path is defined from one or more components of the memory module, through the first layer of soft thermal interface material, the flexible heat-spreading material, and the second layer of soft thermal interface material.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 5:
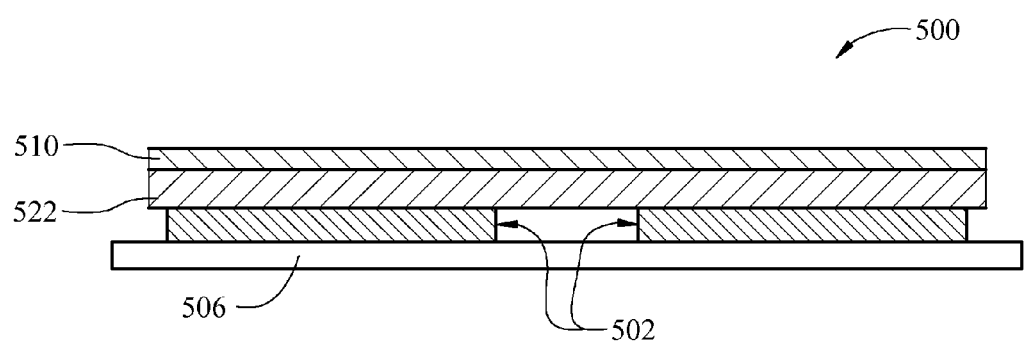
Figure 6:
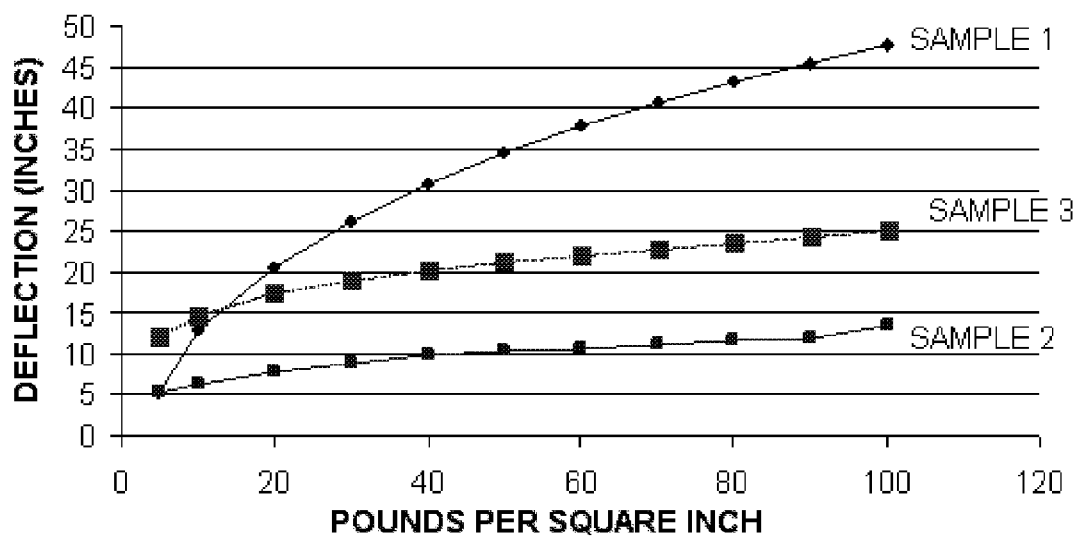

FIG. 5 is a cross-sectional view of a circuit board having one or more electronic components and a thermally-conductive interface assembly in which a flexible graphite sheet include a layer of thermally-conductive polymer along only one side according to exemplary embodiments; and FIG. 6 is a line graph showing deflection in inches versus pounds per square inch of pressure for three different test samples including thermal interface gap filler material, a flexible graphite sheet encapsulated within thermal interface gap filler material, and a perforated graphite sheet encapsulated within thermal gap filler material, according to exemplary embodiments.

Corresponding reference numerals indicate corresponding parts throughout the several views of the drawings.

DETAILED DESCRIPTION

The following description is merely exemplary in nature and is in no way intended to limit the present disclosure, application, or uses.

Thermal interface materials have been used between heat-generating components and heat sinks to establish heat-conduction paths therebetween. As recognized by the inventors hereof, however, thermal interface materials provide a thermally conducting heat path that is substantially contained between the heat generating components and the heat sink, which results in a relative narrow heat conduction path that causes heat to be localized around the electronic component. That is, a substantial portion of heat generated by the electronic component is conducted via the path of least impedance through the thermal interface material that lies directly between the electronic component and the heat sink. This results in limited heat spreading throughout the thermal interface material and the heat sink.

Because the inventors hereof recognized that thermal interface materials provide a limited heat-conduction path, the inventors have disclosed herein various exemplary embodiments of thermally-conductive interface assemblies that include flexible heat-spreading materials (e.g., flexible graphite sheet which may be perforated, etc.) and one or more layers of soft thermal interface material (e.g., thermal interface material disposed on at least one side or on opposite sides of a flexible graphite sheet, etc.). Flexible heat-spreading materials may generally refer to and include a wide range of materials having flexibility equal to or greater than a sheet of stamped aluminum having a thickness of 20 mils and/or flexibility equal to or greater than a sheet of stamped copper having a thickness of 15 mils, etc.

Figure 2:
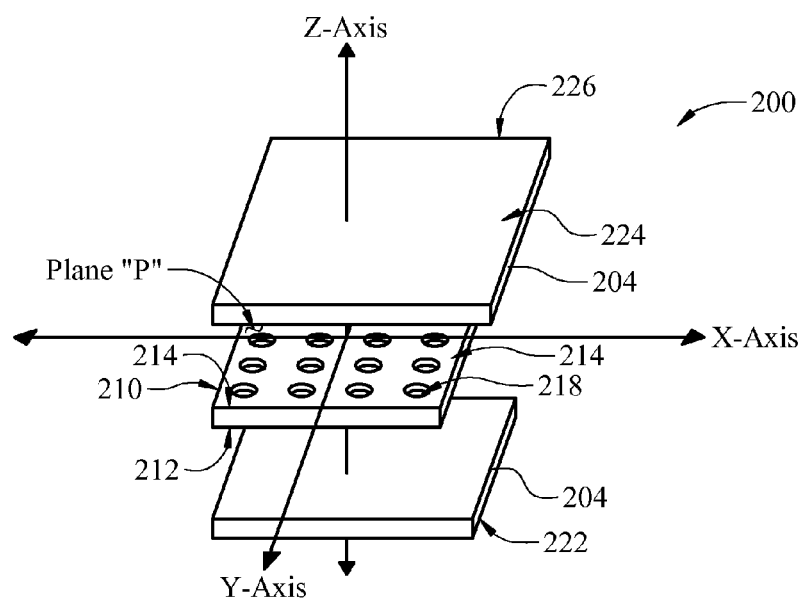
FIG. 2 is an exploded assembly view of another exemplary embodiment of a thermally-conductive interface assembly in which a perforated graphite sheet is encapsulated within or sandwiched between first and second layers of thermally-conductive polymer according to exemplary embodiments.

Within the flexible heat-spreading material, heat laterally spreads out (e.g., laterally spreads out in the X and Y directions shown in FIG. 2, etc.) such that there will be more surface area from which heat may be transferred from the flexible heat-spreading material (e.g., via conduction in the Z direction to thermal interface material and/or convection to air or other ambient environment, etc.). The greater surface area due to the laterally spreading of the heat may increase and improve heat transfer efficiency associated with the flexible heat-spreading material and overall thermally-conductive interface assembly. Depending on the particular embodiment, heat may be transferred from the flexible heat-spreading material via conduction in the Z direction to an outer layer of thermal interface material, such as in those exemplary embodiments in which flexible heat-spreading material is sandwiched between, bonded to, or encapsulated within layers of thermal interface material. Or, for example, heat may be transferred from the flexible heat-spreading material via convection to air or other ambient environment, such as in those exemplary embodiments in which a heat-spreading material includes thermal interface material on only one side such that other side of the heat-spreading material is exposed to air or other ambient environment.

In embodiments in which thermal interface material is on or along only one side of a heat-spreading material, the thickness of the thermal interface material may be greater than the thickness of the flexible heat-spreading material. Alternatively, the thickness of the thermal interface material may be about equal to or less than the thickness of the flexible heat-spreading material in other embodiments. In embodiments in which flexible heat-spreading material is sandwiched between, bonded to, or encapsulated within layers of thermal interface material, the layer(s) of thermal interface material along one side of the flexible heat-spreading material may be thicker, thinner, or about equal to the layer(s) of thermal interface material along the other or opposite side of the flexible heat-spreading material. For example, some embodiments include a flexible heat-spreading material having inner and outer layers of thermal interface material, where the inner layer (which is intended to contact one or more electronic components) is thicker than the outer layer.

Thermally-conductive interface assemblies disclosed herein include one or more outer layers of soft thermal interface materials that are relatively flexible, soft, and/or thin, for example, for good conformance with a mating surface. This, in turn, may help lower thermal impendence as thermal impedance depends, at least in part, upon the degree of effective surface area contact therebetween. The ability to conform to a mating surface tends to be important as the surfaces of a heat sink and/or a heat-generating component are typically not perfectly flat and/or smooth, such that air gaps or spaces (air being a relatively poor thermal conductor) tend to appear between the irregular mating surfaces (e.g., a non-uniform surface that is not flat or continuous, a non-flat surface, curved surface, uneven surface, surface without symmetry, even shape, or formal arrangement, etc.). Therefore, removal of air spaces may thus also help lower the heat-conducting path's thermal impedance and increases the path's thermal conductivity, thereby enhancing the conducting of heat along the path.

In various exemplary embodiments, a thermally-conductive interface assembly as disclosed herein may be utilized in conjunction with a printed circuit board, power amplifier, central processing unit, graphics processing unit, memory module, or other heat-generating component. For example, a thermally-conductive interface assembly may be positioned, sandwiched, or installed between a heat sink and a heat-generating component (e.g., printed circuit board assembly, power amplifier, central processing unit, graphics processing unit, memory module, other heat-generating component, etc.), such that the thermally-conductive interface assembly is in contact with or against a surface of the heat-generating component, whereby a thermally-conducting heat path is defined from the heat-generating component to the thermally-conductive interface assembly and then to the heat sink.

As disclosed herein, various embodiments include a perforated graphite sheet encapsulated within, embedded within, or sandwiched between layers of thermally-conductive polymer. The perforations in the graphite sheet enable a polymer-to-polymer bond to form therethrough. This bond helps keep the sandwich or stack of materials together mechanically as well as providing heat transfer in the Z direction. The perforated graphite sheet (still being a contiguous unit) also provides good X-Y heat transfer or lateral spreading, which, in turn, will increase the surface area from which heat may be transferred from the perforated graphite sheet. Depending on the particular embodiment, heat may be transferred from the perforated graphite sheet via conduction in the Z direction to an outer layer of thermal interface material, such as in those exemplary embodiments in which a perforated graphite sheet is sandwiched between, bonded to, or encapsulated within layers of thermal interface material. Or, for example, heat may be transferred from the perforated graphite sheet via convection to air or other ambient environment, such as in those exemplary embodiments in which a perforated graphite sheet includes only an inner layer of thermal interface material such that the outer surface of the perforated graphite sheet is exposed to air or other ambient environment.

The perforations in the graphite sheet may also improve or increase the flexibility of the graphite sheet. Advantageously, various exemplary embodiments in which a perforated graphite sheet is sandwiched between layers of thermally-conductive polymer may provide improved heat transfer in three planes (e.g., X-Y plane, Y-Z plane, and X-Z plane shown in FIG. 2, etc.) as compared to thermally-conductive polymer alone. Plus, the thermally-conductive polymer may also allow for good conformance and contact between the thermally-conductive interface assembly and the heat generating components, as the thermally-conductive polymer may fill gaps associated with the varying heights of the heat-generating components from the board. In addition, or alternatively, a thermally-conductive interface assembly comprising a perforated graphite sheet is sandwiched between layers of thermally-conductive polymer may also allow for improved or good mechanical integrity of the layers.

In various embodiments, a thermally-conductive interface assembly may be made by die cutting or punching holes in a sheet of graphite. Polymer may be applied to a single side of the perforated graphite sheet, and then the graphite sheet with the polymer thereon may be ran through a pair of rolls or rollers. The polymer is allowed to cure. In embodiments in which the thermally-conductive interface assembly includes upper and lower layers of thermal interface material, polymer may then be applied to the other side of the perforated graphite sheet. The graphite sheet with the polymer on the second side (and the cured polymer on the first side) may again be ran through a pair of rolls or rollers. The polymer on the second side is then also allowed to cure. As another example, polymer may be applied to both sides of the graphite sheet, such that the graphite sheet with the polymer on both sides is ran through a pair of rollers or rolls. After the rolling process, the polymer on both sides is then allowed to cure. In various embodiments, a Mylar protective liner(s) may be disposed over the polymer, for example, to protect the rolls or rollers from the polymer. After curing the polymer, the Mylar protective liner(s) is released and removed.

Various embodiments include a graphite sheet having a thickness of about 0.005 inches (5 mils), 0.01 inch (10 mils), 0.02 inch (20 mils), etc., where the graphite sheet is encapsulated within layers of thermally-conductive polymer having a thickness of about 0.02 inch (20 mils), 0.04 inch (40 mils), etc. In one example, a thermally-conductive interface assembly had a graphite sheet having a thickness of about 0.01 inch (10 mils) encapsulated within, sandwiched between, or bonded to first and second layers of thermal interface material each having a thickness of about 0.02 inch (20 mils). Various embodiments include an upper and/or lower layer of thermal interface material having a thickness of about 5 mils, or a thickness of about 10 mils, or a thickness greater than 5 mils but less than 10 mils, or a thickness less than 5 mils, or a thickness greater than 10 mils. In embodiments that include upper and lower layers of thermal interface material, each layer may have the same or different thickness as the other layer. In various embodiments, the thermally-conductive interface assembly may have an overall thickness up to about ¼ inch, ½ inch, a thickness between ¼ inch and ½ inch, etc. Other embodiments may include different graphite sheet thicknesses, different thermal interface material layer thicknesses, and/or a thermally-conductive interface assembly with an overall thickness less than ¼ inch or greater than ½ inch.

By way of example only, some embodiments include thermally-conductive interface assemblies being utilized in conjunction with a wide range of different types of memory devices or modules, such as random access memory (RAM) modules or devices, double-data-rate (DDR) memory modules or devices (e.g., DDR1, DDR2, DDR3, DDR4, DDR5, etc.), flash memory dual inline memory module (FMDIMM) memory modules or devices, synchronous dynamic random access memory (SDRAM) memory modules or devices, etc. By way of background, DDR stands for double-data-rate, which may be used is used in SDRAM (synchronous dynamic random access memory)—a class of memory integrated circuits used in computers. In various embodiments, a DDR memory module may include multiple chips arranged linearly on both sides of a PCB substrate. A thermally-conductive interface assembly may be disposed along one or both sides of the populated board to spread heat and also to transport heat to a heat sink, thereby helping maintain lower maximum operating temperatures. The thermally-conductive interface assembly may include a flexible heat-spreading material (e.g., graphite, aluminum, copper, flexible sheets thereof which may be perforated, other materials disclosed herein, etc.). The flexible heat-spreading material may be encapsulated within, embedded within, bonded to, and/or sandwiched between first and second layers of soft, compliant thermal interface material (e.g., thermally-conductive polymer, gap filler, other materials disclosed herein, etc.). Or, for example, the thermally-conductive interface assembly may include flexible heat-spreading material with soft, compliant thermal interface material along or on only one side of the flexible heat-spreading material. In some embodiments, a flexible graphite sheet has relatively soft, compliant thermal interface material (e.g., gap filler, thermally-conductive polymer, other suitable thermal interface material, such as those disclosed hereinafter, etc.) along one or both sides of the sheet. In some embodiments, a perforated graphite sheet is sandwiched between two layers of soft, compliant thermal interface material (e.g., gap filler, thermally-conductive polymer, other suitable thermal interface material, such as those disclosed hereinafter, etc.). Te two layers of soft, compliant thermal interface material may have equal or different thicknesses.

In an exemplary operation, heat from the chips of a memory module may be transferred to an inside layer of soft, compliant thermal interface material, which is between the memory module and a flexible graphite sheet. From the inside layer of the thermal interface material, heat may be transferred to the flexible graphite, which in turn laterally spreads the heat (e.g., in the X-Y plane (FIG. 2), etc.). The lateral heat spreading increases the surface area from which heat may be transferred from the graphite sheet, thus increasing heat transfer efficiency. Heat may be transferred from the increased surface area of the graphite sheet to and through an outer layer of the thermal interface material to the ambient surrounding environment. For ease of application of a thermally-conductive assembly or structure including graphite sandwiched between two layers of thermal interface material, one side of the thermal structure may (but not necessarily) be naturally tacky or include a layer of adhesive for attachment to the memory module. The other side may be protected by a layer of foil, for example, in some embodiments. Advantageously, some embodiments may thus allow for a relatively low cost method of providing thermal management and heat dissipation for memory modules, as compared to some existing thermal management solutions that include steel or aluminum heat spreaders and attachment clips.

According to various aspects of the present disclosure, various exemplary embodiments of thermally-conductive interface assemblies provide improved heat dissipation from one or more heat-generating electronic components. Heat from a heat generating component must typically be transferred or dissipated away from the component to avoid damage to the heat producing component, such as a power amplifier, for example. In the following exemplary embodiments (e.g., exemplary embodiments shown in FIGS. 1-4, etc.), the various thermally-conductive interface assemblies may include a flexible graphite sheet having first and second layers of soft, compliant thermal interface material disposed thereon, where the flexible graphite sheet provides heat spreading characteristics (e.g., laterally spread heat in the X-Y plane (FIG. 2), etc.) such that surface area from which heat may be transferred from the flexible graphite sheet is increased, thereby increasing heat transfer efficiency. The following non-limiting examples are provided for purposes of illustration only and not for limitation. For example, the embodiments illustrated in FIGS. 1 through 4 include first and second layers of soft, compliant thermal interface material on the opposite sides of the flexible graphite sheet. But other embodiments such as that shown in FIG. 5 may include soft, compliant thermal interface material along only one side of a flexible graphite sheet or other heat-spreading material. In addition to thermal performance improvement, some exemplary embodiments disclosed herein also include an adhesive layer and/or a protective metal foil layer on one or more sides of the flexible thermally-conductive interface assembly. Further aspects relate to electronic devices/components that include thermally-conductive interface assemblies, methods of using thermally-conductive interface assemblies, and methods of making thermally-conductive interface assemblies.

Figure 1:
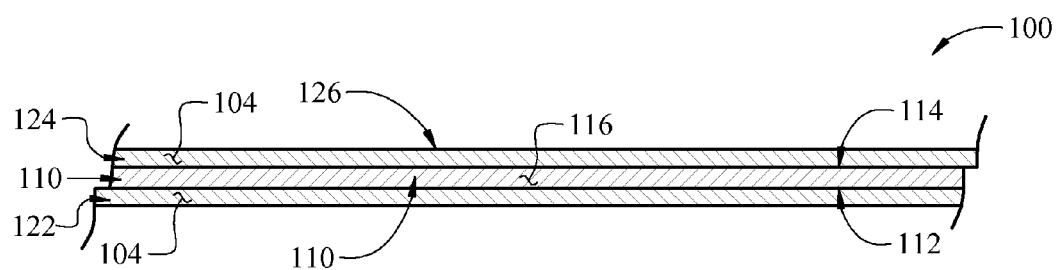
FIG. 1 is a cross-sectional view of a thermally-conductive interface assembly in which a flexible graphite sheet is encapsulated within or sandwiched between first and second layers of thermal interface material according to exemplary embodiments.

Referring now to FIG. 1, there is shown an exemplary embodiment of a thermally-conductive interface assembly 100 embodying one or more aspects of the present disclosure. As shown in FIG. 1, the illustrated thermally-conductive interface assembly 100 generally includes a relatively flexible graphite sheet 110 having first and second sides 112, 114, on which is disposed relatively soft thermal interface material 104 (e.g., gap filler, thermally-conductive polymer, thermally-conductive polymer with fillers therein, other suitable thermal interface materials such as those disclosed hereinafter, etc.). The thermal interface material 104 may be disposed so as to form first and second layers 122, 124 on the respective first and second sides 112, 114 of the flexible graphite sheet 110. Alternative embodiments, however, may include the thermal interface material 104 on only one side 112 or 114 (but not both sides, e.g., assembly 500 in FIG. 5, etc.) of the flexible graphite sheet 110. As used herein, the term "sheet" includes within its meaning graphite (or other materials) in the form of flexible webs, strips, papers, tapes, foils, films, mats, or the like. The term "sheet" includes within its meaning substantially flat material or stock of any length and width.

In various embodiments, the layers 122, 124 are formed from the same thermal interface material 104. Alternative embodiments, however, may include a different thermal interface material along the first side 112 of the flexible graphite sheet 110, than the thermal interface material along the second side 114 of the flexible graphite sheet 110. That is, the first and second layers 122, 124 may be formed from different thermal interface materials (e.g., different thermally-conductive polymers, different types of thermal interface materials, etc.) in some embodiments, or they may be formed from the same thermal interface material in other embodiments. In either case, a wide variety of materials may be used for the thermal interface material, including the materials disclosed herein after. For example, gap filler may be the thermal interface material disposed along both of the first and second sides 112, 114 of the flexible graphite sheet 110. As another example, gap filler may be the thermal interface material disposed along only one of the sides 112 or 114 of the flexible graphite sheet 110, and thermal phase change material may be the thermal interface material disposed along the other side 112 or 114 of the flexible graphite sheet 110.

In addition, the layers 122, 124 may have about the same thickness or they may have different thicknesses. For example, some embodiments may include an inner layer 122 thicker than the outer layer 124, or vice versa.

With continued reference to FIG. 1, the second layer 124 has an outer surface 126 from which heat may be transferred therefrom, such as via conduction to a heat sink (or other structure) and/or convection to air (or other ambient environment). The first or inner layer 122 of soft thermal interface material is configured to provide a thermally-conductive path between the flexible graphite sheet 110 and one or more electronic components (not shown in FIG. 1) that the first layer 122 of soft thermal interface material 104 is intended to contact. Some exemplary embodiments disclosed herein may also include an adhesive layer and/or a protective metal foil layer on the thermally-conductive interface assembly, such as on the bottom surface of the first layer 122 and/or on the outermost surface 126 of the second layer 124. Alternative embodiments include only one of or neither of the adhesive layer and/or protective metal foil layer.

In various embodiments disclosed herein, the first layer 122 of thermal interface material 104 is configured to provide a thermally-conductive path between an electronic component and the flexible graphite sheet 110. A wide variety of materials may be used for the thermal interface material 104 as disclosed herein.

The flexible graphite sheet 110 is encapsulated within, bonded to, or sandwiched between relatively soft, compliant thermal interface material 104 that forms the first and second layers 122, 124. In some embodiments, the flexible graphite sheet 110 may have a thermal conductivity of about 5 Watts per meter Kelvin (W/mK) in the Z or vertical direction shown in FIG. 1. In operation, heat conducted to the graphite sheet 110 from the first layer 122 of thermal interface material 104 will be laterally spread within the graphite sheet 110 (e.g., in the left and right directions and in the directions into and out of the page in FIG. 1, etc.) generally throughout the cross-section 116 of the sheet 110. Heat will also be conducted in the Z direction from the graphite sheet 110 to the second layer 124 of thermal interface material 104. This lateral heat spreading will increase the surface area from which heat may be transferred from the flexible graphite sheet 110, thus increasing heat transfer efficiency. The heat may have been generated by a heat source, such as the one or more electronic components that the first layer 122 of thermal interface material 104 is in contact with.

In any one or more of the embodiments disclosed herein, the flexible graphite sheet (e.g., 110, 210, 310, 410, etc.) may include compressed particles of exfoliated graphite, formed from intercalating and exfoliating graphite flakes, such as eGraf™ commercially available from Advanced Energy Technology Inc. of Lakewood, Ohio. In any one or more of the embodiments disclosed herein, the flexible graphite sheet (e.g., 110, 210, 310, 410, etc.) may be made from one or more of the materials (e.g., graphite, flexible graphite sheet, exfoliated graphite, etc.) disclosed in any one or more of U.S. Pat. No. 6,482,520, U.S. Pat. No. 6,503,626, U.S. Pat. No. 6,841,250, U.S. Pat. No. 7,138,029, U.S. Pat. No. 7,150,914, U.S. Pat. No. 7,160,619, U.S. Pat. No. 7,276,273, U.S. Pat. No. 7,303,820, U.S. Patent Application Publication 2007/0042188, U.S. Patent Application Publication 2007/0077434, U.S. Pat. No. 7,292,441, U.S. Pat. No. 7,306,847, and/or U.S. Pat. No. 3,404,061.

In embodiments in which the sheet is formed from intercalating and exfoliating graphite, the graphite may be processed into a sheet having a thickness within a range of about 0.005 inches to about 0.020 inches. For example, some embodiments include a sheet having a thickness of 0.005 inches, or 0.020 inches, or a thickness greater than 0.005 inches but less than 0.020 inches. Further embodiments may include a sheet having a thickness less than 0.005 inches or greater than 0.020 inches. Plus, other materials and thicknesses may be used for a sheet in addition to or as an alternative to graphite. For example, some embodiments may include a relatively thin sheet of copper and/or or aluminum materials, which may have a comparable flexibility to a graphite sheet.

Referring now to FIG. 2, there is shown another exemplary embodiment of a thermally-conductive interface assembly 200 embodying one or more aspects of the present disclosure. The thermally-conductive interface assembly 200 includes a perforated graphite sheet 210 encapsulated within, bonded to, or sandwiched between two layers 222, 224 of thermal interface material 204. In FIG. 2, the plane "P" is defined by orthogonal X and Y axes and is perpendicular to the Z axis, which is orthogonal to the X and Y axes.

In this example embodiment, the flexible graphite sheet 210 may provide a cross-section with a higher thermal conductivity (or lower thermal impedance) relative to the thermal interface materials 204 encapsulating the perforated graphite sheet 210. In other embodiments, the flexible graphite sheet 210 may have a lower thermal conductivity (or higher thermal impedance) relative to the thermal interface materials 204.

The sheet 210 may be formed from compressed particles of exfoliated graphite, formed from intercalating and exfoliating graphite flakes, such as eGraf™ commercially available from Advanced Energy Technology Inc. of Lakewood, Ohio, for example. The sheet 210 may be made from one or more of the materials (e.g., graphite, flexible graphite sheet, exfoliated graphite, etc.) disclosed in any one or more of U.S. Pat. No. 6,482,520, U.S. Pat. No. 6,503,626, U.S. Pat. No. 6,841,250, U.S. Pat. No. 7,138,029, U.S. Pat. No. 7,150,914, U.S. Pat. No. 7,160,619, U.S. Pat. No. 7,276,273, U.S. Pat. No. 7,303,820, U.S. Patent Application Publication 2007/0042188, U.S. Patent Application Publication 2007/0077434, U.S. Pat. No. 7,292,441, U.S. Pat. No. 7,306,847, and/or U.S. Pat. No. 3,404,061. In alternate embodiments, however, the sheet may be made from relatively thin perforated sheets of copper and/or aluminum materials, which may have a comparable flexibility to a perforated graphite sheet.

With continued reference to FIG. 2, the flexible graphite sheet 210 has first and second sides 212, 214, on which is disposed relatively soft, compliant thermal interface material 204. The thermal interface material 204 is disposed so as to form first and second layers 222, 224 on the respective first and second sides 212, 214 of the flexible graphite sheet 210. The first and second layers 222, 224 of thermal interface material 204 may be applied to the perforated graphite sheet 210, such that the perforated graphite sheet 210 is sandwiched between, bonded to, or encapsulated within the first and second layers 222, 224 of thermal interface material 204. By way of example, polymer or other thermal interface material may be applied to one or both sides of the graphite sheet, and the graphite sheet with the polymer thereon may be ran through a pair of rolls or rollers. The polymer may then be allowed to cure. If the polymer was only applied to one side, then the polymer may be applied to the second side. And, the graphite sheet with the polymer on the second side (and the cured polymer on the first side) may again be ran through a pair of rolls or rollers. The polymer on the second side is then also allowed to cure. As another example, polymer may be applied to both sides of the graphite sheet, such that the graphite sheet with the polymer on both sides is ran through a pair of rollers or rolls. After the rolling process, the polymer on both sides is then allowed to cure. In various embodiments, a Mylar protective liner(s) may be disposed over the polymer, for example, to protect the rolls or rollers from the polymer. After curing the polymer, the Mylar protective liner(s) is released and removed.

In various embodiments, the layers 222, 224 are formed from the same thermal interface material 204. Alternative embodiments, however, may include a different thermal interface material along the first side 212 of the flexible graphite sheet 210, than the thermal interface material along the second side 214 of the flexible graphite sheet 210. That is, the first and second layers 222, 224 may be formed from different thermal interface materials (e.g., different thermally-conductive polymers, different types of thermal interface materials, etc.) in some embodiments, or they may be formed from the same thermal interface material in other embodiments. In either case, a wide variety of materials may be used for the thermal interface material, including the materials disclosed herein after. For example, gap filler may be the thermal interface material disposed along both of the first and second sides 212, 214 of the flexible graphite sheet 210. As another example, gap filler may be the thermal interface material disposed along only one of the sides 212 or 214 of the flexible graphite sheet 210, and thermal phase change material may be the thermal interface material disposed along the other side 212 or 214 of the flexible graphite sheet 210.

In addition, the layers 222, 224 may have about the same thickness or they may have different thicknesses. For example, some embodiments may include an inner layer 222 thicker than the outer layer 224, or vice versa.

In various embodiments, the thermal interface material 204 is generally a thermally-conductive polymer and/or formed from a wide variety of materials such as those disclosed below, such as in TABLES 1 and 2.

In FIG. 2, the flexible graphite sheet 210 includes circular perforations or holes 218 of all the same size that are aligned in rows and columns. Alternative embodiment may include perforations in a different configuration (e.g., different sizes, shapes, arrangement, etc.). For example, other embodiments may include non-circular perforations and/or perforations of different sizes. In addition, the perforations 218 may be variously sized depending, for example, on the particular application or end use, such as desirable thermal conductivity in the Z or vertical direction through the holes, bond strength, etc. By way of example, the perforations 218 may comprise 0.08 inch diameter holes that are punched or die cut in the graphite sheet such that the perforations or holes encompass about 10 percent of the surface area of the graphite sheet. Other embodiments may include different holes that are larger or smaller and/or formed by other methods.

Preferably, the perforations 218 are configured to permit the thermal interface material 204 (e.g., thermally-conductive polymer in some embodiments, etc.) to flow through the perforations 218, for example, to establish a mechanical bond, interface, and/or contact between the two layers 222, 224 of the thermal interface material 204. For example, in those embodiments in which the thermal interface material 204 comprises polymer, a polymer-to-polymer bond may be established via or through the perforations 218. The polymer-to-polymer bond may provide heat transfer through the thermally-conductive polymer in the Z Axis direction, to conduct heat away from a heat source (e.g. an electronic component 302 in FIG. 3, etc.) that the first layer 222 of thermally-conductive material 204 is intended to contact. Because the perforated graphite sheet 210 still remains a substantially contiguous unit despite the perforations 218, the perforated graphite sheet 210 may also provide relatively good heat transfer and lateral heat spreading in the X and Y directions shown in FIG. 2. The lateral heat spreading increases the surface area from which heat may be transferred from the perforated graphite sheet 210, which may increase and improve heat transfer efficiency.

The polymer-to-polymer bond may also help mechanically hold the stack of materials (the sheet 210 and layers 222, 224) together. The perforations 218 may also improve or increase flexibility of the graphite sheet 210. Accordingly, this embodiment of the thermally-conductive interface assembly 200 having the perforated graphite sheet 210 bonded to, sandwiched between, or encapsulated within layers 222, 224 of thermally-conductive polymer may provide improved heat transfer in three planes (e.g., X-Y plane, Y-Z plane, and X-Z plane shown in FIG. 2, etc.) as compared to thermally-conductive polymer alone. In addition, or alternatively, the thermal interface assembly 200 may also allow for improved or good mechanical integrity of the layers.

In various embodiments, the thermal interface material 204 that forms the first and second layers 222, 224 may be naturally or inherently tacky, to facilitate the application and adherence to a heat source, such as one or more electronic components. Alternatively, the thermally-conductive interface assembly 200 may further include an adhesive or other bonding means disposed on or attached to the first and/or second layer 222, 224. In further embodiments, the first and second layers 222, 224 may be neither naturally or inherently tacky and/or the thermally-conductive interface assembly 200 may also not include any adhesive or other bonding means. Additionally, the thermally-conductive interface assembly 200 in some embodiments may further include a metal foil layer (e.g., 342 shown in FIG. 3, etc.) disposed on the outer surface 226 of the second layer 224, for contacting a heat sink (or other structure) that is installed over the thermally-conductive interface assembly 200.

Figure 3:
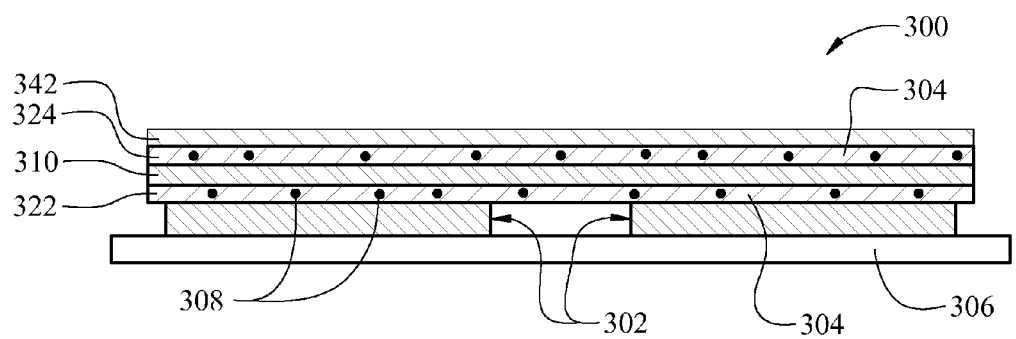
FIG. 3 is a cross-sectional view of a circuit board having one or more electronic components and a thermally-conductive interface assembly in which a flexible graphite sheet is encapsulated within or sandwiched between first and second layers of thermally-conductive polymer including fillers according to exemplary embodiments.

FIG. 3 illustrates another exemplary embodiment of a thermally-conductive interface assembly 30 embodying one or more aspects of the present disclosure. In this particular example, the assembly 300 is shown in connection with a circuit board 306 having electronic components 302. By way of example, the circuit board 306 and electronic components 302 may be associated with a memory device (e.g., random access memory (RAM) modules or devices, double-data-rate (DDR) memory modules or devices (e.g., DDR1, DDR2, DDR3, DDR4, DDR5, etc.), flash memory dual inline memory module (FMDIMM) memory modules or devices, synchronous dynamic random access memory (SDRAM) memory modules or devices, etc.) or other electronic device.

The thermally-conductive interface assembly 300 includes a sheet 310 of thermally-conductive material, such as a flexible graphite sheet (e.g., sheet 110 in FIG. 1, perforated sheet 210 in FIG. 2, etc.), a flexible metal or metallic sheet (e.g., a perforated sheet formed from aluminum and/or copper materials, etc.), etc. The sheet 310 is encapsulated within or sandwiched between two layers 322, 324 of thermal interface material 304. A metal foil layer 342 is disposed on top of the second layer 324, for example, to help protect the second layer 324. When the assembly 300 is installed for use, the metal foil layer 342 may contact a heat sink, or the metal foil layer 342 may operate as a heat convector itself. In other embodiments, the metal foil layer 342 may be removed from the assembly 300 to allow the thermal interface material 304 forming the second layer 324 to make direct contact with a heat sink.

The thermal interface material 304 may comprise a wide variety of materials as disclosed herein, such as thermally-conductive polymer and the materials listed in Tables 1 or 2, etc. For this particular illustrated example, however, the thermal interface material 304 includes thermally-conductive fillers, such as metal particles, ceramic particles, graphite, fibers that are compliant or conformable. In some embodiments, fillers may be distributed in a thermal interface material in a manner such that the fillers contact each other, which may enhance the ability of the thermal interface material to conduct heat, for example, in the Z axis direction. Other embodiments may include thermal interface materials without any fillers.

With continued reference to FIG. 3, the thermally-conductive interface assembly 300 is positioned relative to the circuit board 306 such that the first layer 322 of thermal interface material 304 is applied or in contact with the electronic components 302. Accordingly, heat generated by the electronic components 302 is conducted to the first layer 322, then to the sheet 310, and then to the second layer 324. In some embodiments, the thermally-conductive interface assembly 300 may further include an adhesive or other bonding means for adhering or bonding the first layer 322 to the electronic components 302. Or, for example, the thermal interface material 304 may be naturally tacky such that the first layer 322 adheres to the electronic components 302 without requiring a separate adhesive. In further embodiments, the thermal interface material 304 may be neither naturally or inherently tacky, and/or the thermally-conductive interface assembly 300 may also not include any adhesive or other bonding means.

Figure 4:
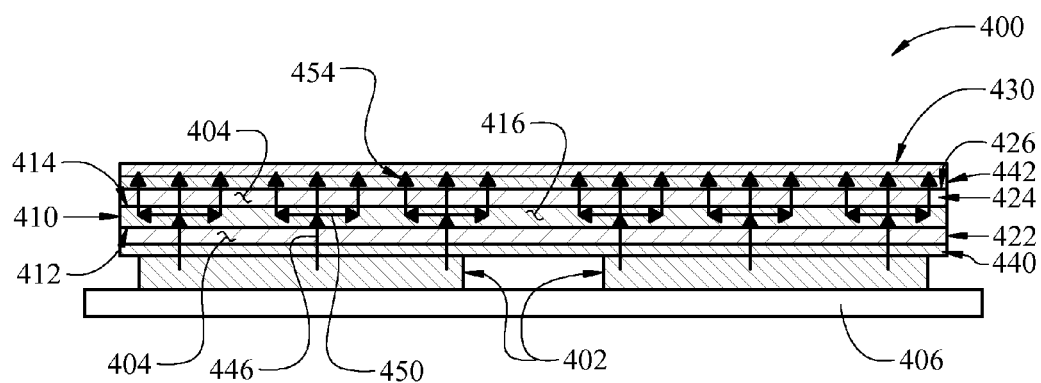
FIG. 4 is a cross-sectional view illustrating a thermally-conductive path from one or more electronic components on a circuit board through a thermally-conductive interface assembly according to exemplary embodiments.

FIG. 4 illustrates a cross-sectional view of an exemplary embodiment of a thermally-conductive interface assembly 400 embodying one or more aspects of the present disclosure. As shown, the thermally-conductive interface assembly 400 includes a sheet 410 of thermally-conductive material, such as a flexible graphite sheet (e.g., sheet 110 in FIG. 1, perforated sheet 210 in FIG. 2, etc.), a flexible metal or metallic sheet (e.g., a perforated sheet formed from aluminum and/or copper materials, etc.), a sheet having flexibility equal to or greater than a sheet of stamped aluminum having a thickness of 20 mils and/or flexibility equal to or greater than a sheet of stamped copper having a thickness of 15 mils, etc.

The sheet 410 has first and second sides 412, 414 that are bonded to, encapsulated with, or sandwiched between two layers 422, 424 of thermal interface material 404. In various embodiments, the thermal interface material 404 may preferably be thermally-conductive polymer. Alternatively, a wide range of other materials may also be used as disclosed herein, such as in Tables 1 and 2.

A metal foil layer 442 is disposed on the outer surface 426 of the second layer 424, for example, to help protect the second layer 424. An adhesive layer 440 is disposed between the first layer 422 of thermal interface material 404 and the electronic components 402 on the circuit board 406. Alternative embodiments do not include the adhesive layer. In such alternative embodiments, the thermal interface material may be naturally tacky or inherently adhesive, to provide for application and adherence to the memory device 402. In further embodiments, the thermal interface material may be neither naturally or inherently tacky and/or the thermally-conductive interface assembly 400 may also not include any adhesive or other bonding means.

In FIG. 4, the thermally-conductive interface assembly 400 is shown positioned generally between a heat sink 430 and a circuit board 406 having one or more electronic components including a memory device 402. By way of example, the memory device 402 may be a random access memory (RAM) module or device, a double-data-rate (DDR) memory module or device, a flash memory dual inline memory module (FM-DIMM) memory module or device, synchronous dynamic random access memory (SDRAM) memory modules, etc.

The thermally-conductive interface assembly 400 is operable such that heat generated by the memory device 402 is transferred to the thermally-conductive interface assembly 400 and ultimately to the heat sink 430.

The first layer 422 of thermal interface material 404 is configured to provide a thermally-conductive path between the flexible graphite sheet 410 and the memory device 402 (as represented by the vertical arrows 446 in FIG. 4). The flexible graphite sheet 410 is configured such that heat conducted to the graphite sheet 410 from the first layer 422 of thermal interface material 404 will be laterally spread within the graphite sheet 410 generally throughout the cross-section 416 of the sheet 410 (as represented by the horizontal arrows 450 in FIG. 4). This lateral heat spreading will increase the surface area from which heat may be transferred from the flexible graphite sheet 410, thus increasing heat transfer efficiency. As represented by vertical arrows 454, heat will also be conducted in the vertical or Z direction from the graphite sheet 410 to the second layer 424 of thermal interface material 404, and then to metal foil layer 442. The second layer 424 of thermal interface material 404 thus provides a thermally-conductive path from the flexible graphite sheet 410 to the metal foil layer 442. From the metal foil layer 442, heat may be transferred to the heat sink 430. Accordingly, the thermally-conductive interface assembly 400 provides a heat path (represented by arrows 446, 450, 454) from the memory device 402 to the heat sink 430.

FIG. 5 illustrates a cross-sectional view of an exemplary embodiment of a thermally-conductive interface assembly 500 embodying one or more aspects of the present disclosure. As shown, the thermally-conductive interface assembly 500 includes a flexible graphite sheet 510 and a layer 522 of thermal interface material along only one side of the flexible graphite sheet. In some embodiments, a metal foil layer may be disposed along the other side of the flexible graphite sheet 510. In some embodiments, the layer 522 is thicker than the graphite sheet 510. In some embodiments, the thermal interface material may be thermally-conductive polymer. Alternatively, a wide range of other materials may also be used as disclosed herein, such as in Tables 1 and 2.

In FIG. 5, the thermally-conductive interface assembly 500 is shown positioned relative to the circuit board 506 such that the layer 522 of thermal interface material is in contact with the electronic components 502 (e.g., memory device, etc.) on the board 506. Accordingly, the thermally-conductive interface assembly 500 is operable such that heat generated by the electronic components 502 is transferred to the thermally-conductive interface assembly 500.

In some embodiments, the thermally-conductive interface assembly 500 may include a perforated graphite sheet 510. In such embodiments, thermal interface material may be disposed in one or more perforations of the perforated graphite sheet 510, which, in turn, may help bond the thermal interface material to the sheet 510.

Further aspects relate to methods of using thermal management assemblies. In one exemplary embodiment, a method is disclosed for providing heat dissipation or transfer from one or more heat generating components of a circuit board having a thermally-conductive interface assembly that includes at least one of a first and/or second layer of a thermally-conductive interface material disposed on at least one or both sides of a flexible graphite sheet. The method may include contacting one or more heat generating components with a first layer of a thermally-conductive interface material of the thermally-conductive interface assembly. The method may further include establishing a heat spreading thermally-conductive path through the thermally-conductive interface assembly, for conducting heat away from the one or more heat generating components through the first layer and laterally throughout the flexible graphite sheet. In some embodiments, heat may then be transferred to an outer surface of the second layer of thermal interface material for heat transfer therefrom, such as by conduction to a heat sink or convection to air, etc. Accordingly, heat generated by the one or more heat generating components may thus be transferred through the thermally-conductive path, to thereby dissipate heat from the one or more heat generating components.

Additional aspects provide methods relating to thermally-conductive interface assemblies, such as methods of using and/or making thermally-conductive interface assemblies. In an exemplary embodiment, a method generally includes applying thermal interface material onto a perforated graphite sheet. With this exemplary method, the perforated graphite sheet is bonded to, encapsulated within, and/or sandwiched between first and second layers of thermal interface material. In addition, a bond may be established by thermal interface material within the one or more perforations in the flexible graphite sheet, where that bond provides a mechanical connection/bond between the layers and/or a thermally-conductive heat path from the first layer to the second layer through the thermal interface material within the one or more perforations.

Another exemplary embodiment provides a method relating to heat dissipation or transfer from one or more heat generating components of a circuit board. In this example, a method generally includes positioning a thermally-conductive interface assembly (which comprises a flexible graphite sheet having thermal interface material on one side or that is encapsulated within and sandwiched between first and second layers of thermal interface material) such that a thermally-conductive heat path is defined from the one or more heat generating components through the first layer of thermal interface material to the flexible graphite sheet, and, in some embodiments, to the second layer of thermal interface material.

In another exemplary embodiment, a method for making a thermally-conductive interface assembly is disclosed, which includes depositing a thermal interface material onto opposing sides of a perforated graphite sheet. The method may include applying the thermal interface material to the perforated graphite sheet, such that thermal interface material within the perforations in the graphite sheet establishes a polymer-to-polymer bond (or other bond depending on the particular thermal interface materials used). The bond may provide heat transfer through the thermally-conductive polymer in the Z-axis direction. And, the perforated graphite sheet may be encapsulated within and sandwiched between first and second layers of thermal interface material. The method may further include depositing a layer of an adhesive onto an outer surface of the first layer of thermal interface material, and/or depositing a layer of metal foil onto an outer surface of the second layer of thermal interface material.

In various embodiments, the method of making a thermally-conductive interface assembly includes die cutting or punching holes in a sheet of graphite. Polymer may be applied to a single side of the perforated graphite sheet, and then the graphite sheet with the polymer thereon may be ran through a pair of rolls or rollers. The polymer is allowed to cure. In embodiments in which the thermally-conductive interface assembly includes upper and lower layers of thermal interface material, polymer may then be applied to the other side of the perforated graphite sheet. The graphite sheet with the polymer on the second side (and the cured polymer on the first side) may again be ran through a pair of rolls or rollers. The polymer on the second side is then also allowed to cure. As another example, polymer may be applied to both sides of the graphite sheet, such that the graphite sheet with the polymer on both sides is ran through a pair of rollers or rolls. After the rolling process, the polymer on both sides is then allowed to cure. In various embodiments, a Mylar protective liner(s) may be disposed over the polymer, for example, to protect the rolls or rollers from the polymer. After curing the polymer, the Mylar protective liner(s) is released and removed.

Another exemplary embodiment is related to a method of heat dissipation or transfer from a memory module (e.g., random access memory (RAM) modules or devices, double-data-rate (DDR) memory modules or devices (e.g., DDR1, DDR2, DDR3, DDR4, DDR5, etc.), flash memory dual inline memory module (FMDIMM) memory modules or devices, synchronous dynamic random access memory (SDRAM) memory modules or devices, etc.). In this exemplary embodiment, a method generally includes positioning a thermally-conductive interface assembly, which comprises a heat-spreading material (e.g., graphite, aluminum, copper, graphite sheet, perforated graphite sheet, other materials disclosed herein, etc.) having soft, compliable thermal interface material on one side thereof or that is encapsulated within and sandwiched between first and second layers of soft, compliable thermal interface material (e.g., thermally-conductive polymer, gap filler, other material disclosed herein, etc.), such that a thermally-conductive heat path is defined from one or more components of the memory module, through the soft, compliable thermal interface material to the heat-spreading material, and, in some embodiments, to the second layer of soft, compliable thermal interface material.

As noted above, a wide variety of materials may be used for any one or more thermal interface materials in embodiments disclosed herein. Preferably, a thermal interface material is formed from materials, which are better thermal conductors and have higher thermal conductivities than air alone.

In some embodiments, the thermal interface material is a gap filler (e.g., T-flex™ gap fillers from Laird Technologies, etc.). By way of example, the gap filler may have a thermal conductivity of about 3 Watts per meter Kelvin (W/mK). By way of further example, the gap filler may have a thermal conductivity of about 1.2 W/mK. Additional exemplary gap fillers may have a thermal conductivity of about 6 W/mK. In still further embodiments, the thermal interface material is a thermally-conductive insulator (e.g., T-gard™ 500 thermally-conductive insulators from Laird Technologies).

In other embodiments, the thermal interface material may comprise a gap filler on one side of the heat-spreading material and a thermal phase change material (e.g., T-pcm™ 580S series phase change material from Laird Technologies, Inc., etc.) on the other side of the heat-spreading material. In such embodiments, a thermal phase change material may be used, by way of example, that has a phase change softening point of about 50° Celsius, an operating temperature range of about −40° Celsius to about 125° Celsius, and a thermal conductivity of about 3.8 W/mK. Other thermal phase change materials may also be used.

TABLE 1 below lists various exemplary thermal interface materials that may be used as a thermal interface material in any one or more exemplary embodiments described and/or shown herein. These exemplary materials are commercially available from Laird Technologies, Inc. of Saint Louis, Mo., and, accordingly, have been identified by reference to trademarks of Laird Technologies, Inc. This table and the materials and properties listed therein are provided for purposes of illustration only and not for purposes of limitation.

TABLE 1

| Name | Construction Composition | Type |
| --- | --- | --- |
| T-flex ™ 300 | Ceramic filled silicone elastomer | Gap Filler |
| T-flex ™ 600 | Boron nitride filled silicone elastomer | Gap Filler |
| T-pcm ™ 580 | Metal/ceramic filled matrix | Phase Change Material |
| T-pcm ™ 580S | Metal/ceramic filled matrix | Phase Change Material |
| T-gard ™ 500 | Ceramic filled silicone rubber on electrical grade fiberglass | Thermally-conductive Insulator |

In some preferred embodiments, the thermal interface material is formed from T-flex™ 600 or T-flex™ 700 series thermal gap filler materials commercially available from Laird Technologies, Inc. of Saint Louis, Mo. In one particular preferred embodiment, the thermal interface material comprises T-flex™ 620 thermal gap filer material, which generally includes reinforced boron nitride filled silicone elastomer. In another embodiment, the thermal interface material may comprise T-flex™ HR600, which is a metal and ceramic filled silicone elastomer gap filler. By way of further example, other embodiments include a thermal interface material molded from electrically-conductive elastomer. Additional exemplary embodiments include thermal interface materials formed from ceramic and metal particles in a base of rubber, gel, grease or wax matrix, which may be reinforced with fiberglass or metal meshes, etc. Table 2 below lists various exemplary materials that may be used as a thermal interface material in any one or more embodiments described and/or shown herein. These example materials are commercially available from Laird Technologies, Inc. of Saint Louis, Mo., and, accordingly, have been identified by reference to trademarks of Laird Technologies, Inc. This table is provided for purposes of illustration only and not for purposes of limitation.

TABLE 2

| Name | Construction Composition | Type | Thermal Conductivity [W/mK] | Thermal Impedance [° C.-cm2/W] | Pressure of Thermal Impedance Measurement [kPa] |
|---|---|---|---|---|---|
| T-flex ™ 620 | Reinforced boron nitride filled silicone elastomer | Gap Filler | 3.0 | 2.97 | 69 |
| T-flex ™ 640 | Boron nitride filled silicone elastomer | Gap Filler | 3.0 | 4.0 | 69 |
| T-flex ™ 660 | Boron nitride filled silicone elastomer | Gap Filler | 3.0 | 8.80 | 69 |
| T-flex ™ 680 | Boron nitride filled silicone elastomer | Gap Filler | 3.0 | 7.04 | 69 |
| T-flex ™ 6100 | Boron nitride filled silicone elastomer | Gap Filler | 3.0 | 7.94 | 69 |
| T-pcm ™ 5810 | Non-reinforced film | Phase Change | 3.8 | 0.12 | 69 |
| T-flex ™ 320 | Ceramic filled silicone elastomer | Gap Filler | 1.2 | 8.42 | 69 |

In addition to the examples listed in the table above, other thermal interface materials can also be used, which are preferably better than air alone at conducting and transferring heat. Other exemplary materials include compliant or conformable silicone pads, non-silicone based materials (e.g., non-silicone based gap filler materials, elastomeric materials, etc.), polyurethane foams or gels, thermal putties, thermal greases, etc. In some embodiments, one or more conformable thermal interface pads are used having sufficient conformability for allowing a pad to relatively closely conform to the size and outer shape of an electronic component when placed in contact with the electronic component. In various embodiments, a thermally-conductive interface assembly (or portion thereof) may also be configured to provide electromagnetic interference (EMI) shielding.

The following example and test results are merely illustrative, and do not limit this disclosure in any way. For this example, three test specimens were created in order to better understand the lateral heat transfer/spreading of thermal interface gap filler material alone (sample 1) in comparison to flexible graphite encapsulated within thermal interface gap filler material (sample 2), and perforated graphite encapsulated within the thermal interface gap filler material (sample 3). More specifically, the first test sample comprised a 0.05 inch thick strip of thermal interface gap filler material. The second test sample comprised a 0.01 inch thick flexible graphite sheet sandwiched between 0.02 inch thick first layer of the thermal interface gap filler material and a 0.02 inch thick second layer of the thermal interface gap filler material. The third test sample included the same configuration as the second test sample (i.e., 0.01 inch thick flexible graphite sheet sandwiched between 0.02 inch thick layers of the thermal interface gap filler material), but the flexible graphite sheet of the third test sample included 0.08 inch diameter punched circular holes/perforations, where the holes/perforations made up about 10 percent of the surface area of the flexible graphite sheet. Each test sample was cut into a strip 2.875 inches long by 1.063 inches wide.

For each test sample, two thermocouples (T1 & T2) were attached to one side of the corresponding strip about two inches apart near the top and bottom ends of the strip. A foil heater was attached on the opposite side (bottom end) of the strip. A variable DC power supply was used for powering the foil heater. A meter was used with the thermocouples. Analytical balance was used as test chamber (reduce convection currents from HVAC).

During the testing for each sample, power was applied to the foil heater at 1 watt, 2 watts, 3 watts, and 5 watts. After stabilization, temperatures were recorded from each thermocouple. Below is a table summarizing the results of the testing of samples 1, 2, and 3. In the table, Tamb refers to ambient temperature in degrees Celsius which the testing took place, T1 and T2 refer to the temperature readings in degrees Celsius at the first and second thermocouples, and ΔT refers to the difference between T2 and T1. As can be shown by the table below, Samples #2 and #3 were better at spreading heat than Sample #1.

| | Sample #1 Tamb = 22.5 C. | | | Sample #2 Tamb = 22.3° C. | | | Sample #3 Tamb = 21.4° C. | | |
|---|---|---|---|---|---|---|---|---|---|
| Watts | T2 (° C.) | T1 (° C.) | ΔT (° C.) | T2 (° C.) | T1 (° C.) | ΔT (° C.) | T2 (° C.) | T1 (° C.) | ΔT (° C.) |
| 1 | 69.2 | 29.3 | 39.9 | 50.4 | 39.1 | 11.3 | 48.9 | 37.0 | 11.9 |
| 2 | 117.5 | 35.5 | 82.0 | 74.4 | 51.6 | 22.8 | 71.4 | 48.6 | 22.8 |
| 3 | 159.8 | 40.8 | 119.0 | 97.0 | 63.6 | 33.4 | 93.9 | 59.7 | 34.2 |
| 5 | N/A | N/A | N | 146.4 | 84.0 | 62.4 | 136.4 | 78.4 | 58.0 |

In addition, the deflection of the three test samples was also tested. FIG. 6 illustrates a line graph showing deflection in inches versus pounds per square inch of pressure. As shown by FIG. 6, Samples #2 and #3 had good deflection characteristics.

Exemplary embodiments (e.g., 100, 200, 300, 400, 500, etc.) disclosed herein may be used with a wide range of electronic components, heat sources, heat-generating components, heat sinks, among others. By way of example only, thermal interface assemblies disclosed herein may be used with memory modules or devices (e.g., random access memory (RAM) modules or devices, double-data-rate (DDR) memory modules or devices (e.g., DDR1, DDR2, DDR3, DDR4, DDR5, etc.), flash memory dual inline memory module (FMDIMM) memory modules or devices, synchronous dynamic random access memory (SDRAM) memory modules or devices, etc.), printed circuit boards, high frequency microprocessors, central processing units, graphics processing units, laptop computers, notebook computers, desktop personal computers, computer servers, thermal test stands, portable communications terminals (e.g., cellular phones, etc.), etc. Accordingly, aspects of the present disclosure should not be limited to use with any one specific type of end use, electronic component, part, device, equipment, etc.

Numerical dimensions and the specific materials disclosed herein are provided for illustrative purposes only. The particular dimensions and specific materials disclosed herein are not intended to limit the scope of the present disclosure, as other embodiments may be sized differently, shaped differently, and/or be formed from different materials and/or processes depending, for example, on the particular application and intended end use.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A thermally-conductive interface assembly comprising a perforated thermally-conductive sheet having first and second sides and one or more perforations extending through the perforated thermally-conductive sheet from the first side to the second side, the perforated thermally-conductive sheet sandwiched between first and second layers of thermal interface material, which comprises non-phase change gap filler that is conformable to mating surfaces such that the first and second layers of thermal interface material are respectively conformable to one of the mating surfaces of at least one heat generating component of an electronic device and one of the mating surfaces of a heat dissipating member, wherein each of the first and second layers of thermal interface material has a layer thickness greater than a thickness of the perforated thermally-conductive sheet;

wherein:
the perforated thermally-conductive sheet comprises a flexible graphite sheet; and
the thermal interface material comprises thermally-conductive polymer that encapsulates the flexible graphite sheet, covers the one or more perforations, and forms a polymer-to-polymer bond through the one or more perforations, whereby the polymer-to-polymer bond helps mechanically bond the first and second layers to the flexible graphite sheet and helps provide heat conduction between the first and second layers.

2. The thermally-conductive interface assembly of claim 1, wherein a portion of the thermal interface material is disposed within the one or more perforations, and helps form a thermally-conductive pathway between the first and second layers, and wherein the thermal interface material comprises elastomer and at least one thermally-conductive metal, boron nitride, and/or ceramic filler, such that the thermal conductivity is at least 1.2 Watts per meter per Kelvin and such that the thermal interface material is conformable even without undergoing a phase change or reflow.

3. A thermally-conductive interface assembly comprising a perforated thermally-conductive sheet having first and second sides and one or more perforations extending through the perforated thermally-conductive sheet from the first side to the second side, the perforated thermally-conductive sheet sandwiched between first and second layers of thermal interface material, which comprises non-phase change gap filler that is conformable to mating surfaces such that the first and second layers of thermal interface material are respectively conformable to one of the mating surfaces of at least one heat generating component of an electronic device and one of the mating surfaces of a heat dissipating member, wherein each of the first and second layers of thermal interface material has a layer thickness greater than a thickness of the perforated thermally-conductive sheet; wherein the perforated thermally-conductive sheet comprises particles of intercalated and exfoliated graphite flakes formed into a flexible graphite sheet, wherein the perforations allow the thermal interface material to flow through the perforations whereby the thermal interface material fills the perforations and establishes a mechanical bond between the first and second layers through the perforations, and wherein the thermal interface material is softer and/or more conformable than the flexible graphite sheet.

4. The thermally-conductive interface assembly of claim 3, wherein the thermal interface material comprises thermally-conductive polymer that encapsulates the flexible graphite sheet, covers the one or more perforations, and forms a polymer-to-polymer bond through the one or more perforations, whereby the polymer-to-polymer bond helps mechanically bond the first and second layers to the flexible graphite sheet and helps provide heat conduction between the first and second layers.

5. The thermally-conductive interface assembly of claim 1, wherein the thermal interface material comprises a thermally conductive polymer gap filler pad having a thermal conductivity of at least 1.2 Watts per meter per Kelvin.

6. The thermally-conductive interface assembly of claim 1, wherein the first layer is formed from a different thermal interface material than the second layer.

7. The thermally-conductive interface assembly of claim 1, wherein the thermal interface material comprises elastomer and at least one thermally-conductive metal, boron nitride, and/or ceramic filler.

8. The thermally-conductive interface assembly of claim 1, wherein the thermally-conductive interface assembly further includes a metal foil layer disposed on the outer surface of the second layer of thermal interface material.

9. An electronic device including the thermally-conductive interface assembly of claim 1, wherein the thermal interface material has a thermal conductivity of at least 1.2 Watts per meter per Kelvin.

10. The thermally-conductive interface assembly of claim 1, wherein the thermal interface material comprises a soft thermal interface material that is conformable even without undergoing a phase change or reflow.

11. The thermally-conductive interface assembly of claim 10, wherein the soft thermal interface material comprises thermally-conductive polymer gap filler.

12. The thermally-conductive interface assembly of claim 10, wherein:
the first layer of soft thermal interface material provides a thermally-conductive path between the flexible graphite sheet and an outer surface of the first layer of soft thermal interface material that is intended to contact one or more electronic components;
the flexible graphite sheet laterally spreads heat therein; and
the second layer of soft thermal interface material provides a thermally-conductive path from the flexible graphite sheet to an outer surface of the second layer of soft thermal interface material.

13. The thermally-conductive interface assembly of claim 10, wherein the flexible graphite sheet comprises particles of intercalated and exfoliated graphite flakes formed into a flexible graphite sheet.

14. The thermally-conductive interface assembly of claim 10, wherein the flexible graphite sheet comprises particles of intercalated and exfoliated graphite flakes formed into a flexible graphite sheet having one or more perforations.

15. The thermally-conductive interface assembly of claim 10, wherein the soft thermal interface material comprises elastomer and at least one thermally-conductive metal, boron nitride, and/or ceramic filler, such that the thermal conductivity is at least 1.2 Watts per meter per Kelvin.

16. The thermally-conductive interface assembly of claim 10, wherein:
the thermally-conductive interface assembly further includes a metal foil layer disposed on the outer surface of the second layer of soft thermal interface material; and/or
the first layer is formed from a different thermal interface material than the second layer.

17. An electronic device including the thermally-conductive interface assembly of claim 10, wherein the soft thermal interface material comprises elastomer and at least one thermally-conductive metal, boron nitride, and/or ceramic filler, such that the thermal conductivity is at least 1.2 Watts per meter per Kelvin.

18. The thermally-conductive interface assembly of claim 1 suitable for use in dissipating or transferring heat from one or more heat generating components of a circuit board, whereby the thermal interface material provides at least a portion of a thermally-conductive path between the flexible graphite sheet and the one or more heat-generating components when the thermally-conductive interface assembly is positioned relative to the circuit board such that the first layer of thermal interface material is in contact with and conforms to an outer surface portion of at least one of the one or more heat generating components.

19. The thermally-conductive interface assembly of claim 18, wherein the thermal interface material comprising elastomer and at least one thermally-conductive metal, boron nitride, and/or ceramic filler.

20. The thermally-conductive interface assembly of claim 18, further comprising a metal foil layer disposed over the second layer of thermal interface material for helping to protect said second layer of thermal interface material.

21. An electronic device including a circuit board having one or more electronic components and the thermally-conductive interface assembly of claim 18, wherein the non-phase change gap filler is in contact with and in relatively close conformance to an outer surface portion of the one or more heat generating components, and wherein the thermal interface material comprises elastomer and at least one thermally-conductive metal, boron nitride, and/or ceramic filler, such that the thermal conductivity is at least 1.2 Watts per meter per Kelvin and such that the thermal interface material is conformable even without undergoing a phase change or reflow.

* * * * *